(12) United States Patent
Frutschy et al.

(10) Patent No.: US 7,585,693 B2
(45) Date of Patent: Sep. 8, 2009

(54) METHOD OF FORMING A MICROELECTRONIC PACKAGE USING CONTROL OF DIE AND SUBSTRATE DIFFERENTIAL EXPANSIONS AND MICROELECTRONIC PACKAGE FORMED ACCORDING TO THE METHOD

(75) Inventors: Kristopher J. Frutschy, Phoenix, AZ (US); Sudarshan V. Rangaraj, Chandler, AZ (US); Kevin B. George, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 162 days.

(21) Appl. No.: 11/395,102

(22) Filed: Mar. 31, 2006

(65) Prior Publication Data

US 2007/0231952 A1 Oct. 4, 2007

(51) Int. Cl.
H01L 21/00 (2006.01)
(52) U.S. Cl. ............ 438/55; 438/54; 438/118; 257/747; 257/E23.02
(58) Field of Classification Search ........ 438/106, 438/15, 17, 25, 26, 51, 55, 64, 108, 107, 438/114, 115, 127; 257/738, 772, 779, 780, 257/781, E21.499, E23.02
See application file for complete search history.

(56) References Cited

U.S. PATENT DOCUMENTS

| | | | | |
|---|---|---|---|---|
| 5,817,545 A | * | 10/1998 | Wang et al. | 438/127 |
| 6,228,680 B1 | * | 5/2001 | Thomas | 438/108 |
| 6,333,563 B1 | * | 12/2001 | Jackson et al. | 257/778 |
| 6,649,833 B1 | * | 11/2003 | Caletka et al. | 174/541 |
| 6,653,172 B2 | * | 11/2003 | DiStefano et al. | 438/125 |
| 6,716,754 B2 | * | 4/2004 | Hofmann | 438/690 |
| 6,977,429 B2 | * | 12/2005 | Odegard et al. | 257/685 |
| 7,262,079 B2 | * | 8/2007 | Xie | 438/108 |
| 2006/0208352 A1 | * | 9/2006 | Lee et al. | 257/701 |

OTHER PUBLICATIONS

David Haliday, Resnick, Walker "Fundamentals of Physics", 7th edition, IDSN0-471-46509-7, pp. 317 and 509.*

* cited by examiner

Primary Examiner—Michael S. Lebentritt
Assistant Examiner—Daniel Whalen
(74) Attorney, Agent, or Firm—Blakely, Sokoloff, Taylor & Zafman LLP

(57) ABSTRACT

Method of forming a microelectronic package using control of die and substrate differential expansions. The method includes: providing a die-substrate combination including a substrate, a die disposed on the substrate, and plurality of solder paste disposed between the die and the substrate; reflowing the solder paste by exposing the die-substrate combination to temperatures changes including heating the die-substrate combination to liquefy the solder paste, and cooling down the die-substrate combination until the solder paste has solidified to form solder joints to yield the package; and controlling an expansion of the die and the substrate at least during cooling down to mitigate a relative difference in volumetric strain between the die and the substrate. Controlling may comprise exposing the die-substrate combination to pressure changes at least during cooling down.

18 Claims, 5 Drawing Sheets

METHOD OF FORMING A MICROELECTRONIC PACKAGE USING CONTROL OF DIE AND SUBSTRATE DIFFERENTIAL EXPANSIONS AND MICROELECTRONIC PACKAGE FORMED ACCORDING TO THE METHOD

FIELD OF THE INVENTION

Embodiments of the present invention relate generally to methods of packaging microelectronic devices.

BACKGROUND OF THE INVENTION

Flip-chip attach processes typically involve a reflow of solder bumps to form solder joints between a die and substrate. The substrate usually includes substrate bumping sites thereon, and the die includes die bumping sites thereon adapted to be joined to the substrate bumping sites to establish an electrical connection between the die and the substrate. Solder bumps are provided onto bumping sites of the substrate and/or die. Typically, temperatures necessary to reflow the solder bumps lead to an expansion of each of the die and the substrate. During cooling, different shrinkage amounts of the die and substrate resulting from a mismatch between the relative coefficients of thermal expansion (CTE's) of the die and the substrate do sometimes lead to cracks within the die and/or to a shear deformation of the interconnect joints, especially when a mechanically weak interlayer dielectric (ILD) is used on the die. The ILD of the die usually tends to experience increased thermo-mechanical stresses in the area under the solder joints during die and substrate attach, which stresses lead to increased under bump ILD cracking.

One method the prior art uses to mitigate the above problem is to use lead based die bumps or lead based substrate solder, which tend to deform easily and to therefore at least partially accommodate the CTE driven deformation between the die and the substrate. However, the negative environmental impacts resulting form the use of lead-based bumps and solder are well known and documented.

Another method the prior art uses to mitigate the above problem is to use underfill materials compensate for the differences in CTE of the die and the substrate before the joint, die, and substrate cool down. For example, capillary underflow regime or a no-flow underfill regime may be used to reduce the effects of a CTE mismatch between die and substrate. However, disadvantageously, even such underfill regimes sometimes cannot always effectively mitigate the problems associated with a die-substrate CTE mismatch.

The prior art fails to provide an effective and reliable method of joining a die to a substrate.

Figure 1:
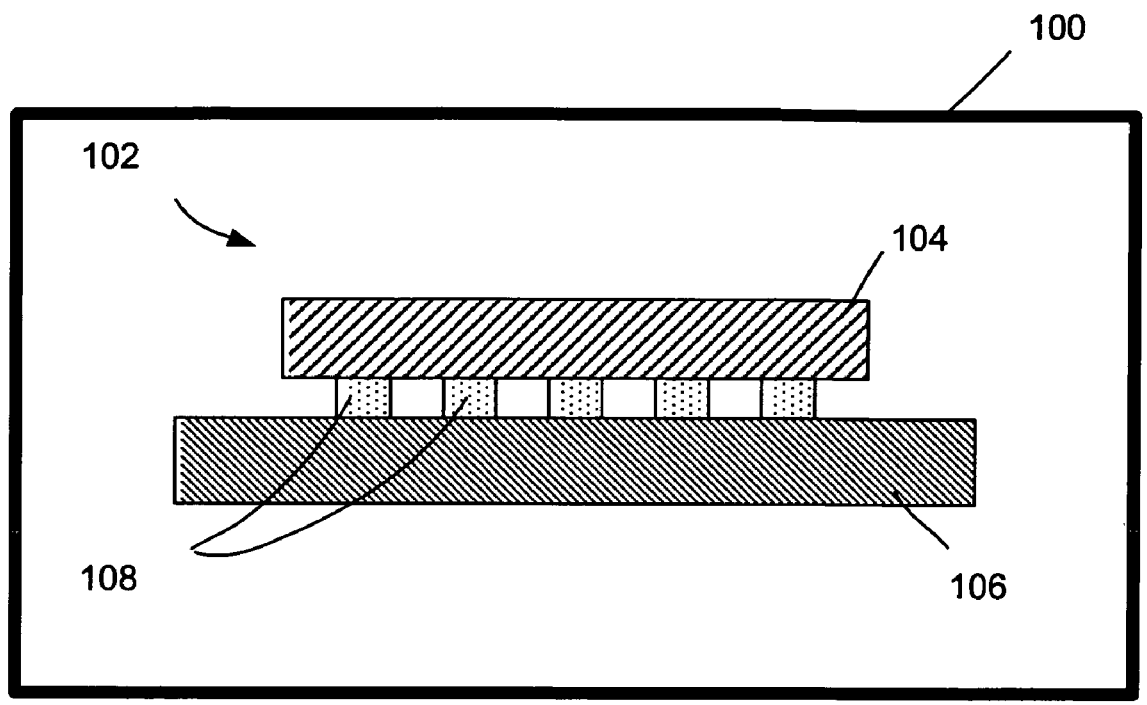
FIGS. 1, 2 and 5 are schematic illustrations showing an arrangement in various stages of attaching a die to a substrate according to a preferred embodiment.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a method of forming a microelectronic package is disclosed. Reference is made to the accompanying drawings within which are shown, by way of illustration, a preferred embodiment by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

In one embodiment, a method of forming a microelectronic package is disclosed. Aspects of method embodiments will be discussed herein with respect to FIGS. 1-5 below. The figures, however, should not be taken to be limiting, as they are intended for the purpose of explanation and understanding.

Embodiments pertain to a method of forming a microelectronic package comprising providing a die-substrate combination including a substrate, a die disposed on the substrate, and material to be cured disposed between the die and the substrate. The material to be cured may include either solder paste or an underfill material, or any other material between the die and the substrate which would need to be subjected to elevated temperatures in order to be cured. Method embodiments further include curing the material to be cured by exposing the die-substrate combination to temperature changes and by thereafter cooling down the die-substrate combination until the material to be cured has cured to yield the package. For example, curing could, according to an embodiment, include reflowing a solder paste in order to solidify the solder paste to form solder joints. Method embodiments further comprise controlling an expansion of the die and the substrate at least during cooling down to mitigate a relative difference in volumetric strain between the die and the substrate. According to a preferred embodiment, controlling an expansion includes subjected the die-substrate combination to pressure changes.

Referring first to FIG. 1 by way of example, an arrangement is shown according to a preferred embodiment to attach a die to a substrate. The arrangement comprises a hot isostatic press chamber 100, and a die-substrate combination (DSC) 102 disposed within chamber 100. DSC 102 includes a die 104, a substrate 106, and solder paste 108 disposed between the die 104 and substrate 106. The solder paste 108 may include any of the conventional solder paste, such as, for example, solder pastes containing SnAgCu, SnAg, SnIn, SnInCu, or any other of the well known solder pastes. Solder paste 108 is shown as having been provided at various locations corresponding to bumping sites (not shown) of the die and of the substrate. The chamber 100 may correspond to a hot isostatic press chamber of any commercially available hot isostatic press, such as, for example, an Avure Autoclave Mini-HIPper® as a lab tool or a Avure Autoclave HIPper® for high volume manufacturing, both of the above presses being manufactured by Avure Autoclave Systems of Columbus, Ohio, USA.

Figure 2:
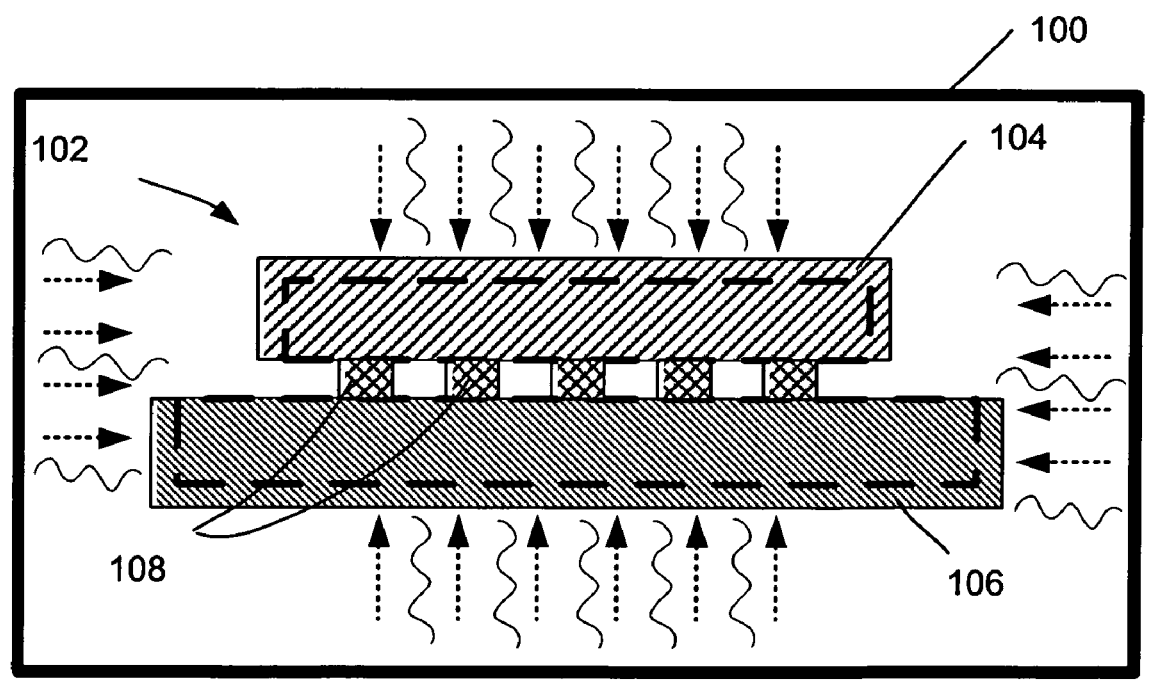

Referring next to FIG. 2 by way of example, the DSC 102 may be subjected to temperatures changes in chamber 100 to effect a reflow of the solder paste. By "temperature changes," what is meant in the context of the present description are positive changes in temperature occurring over time as measured against a reference temperature, for example room temperature, such as, for example, a reference temperature measuring 22 degrees Celsius. In effect, the temperature changes denote elevated temperatures as measured against the reference temperature. Such elevated temperatures are indicated in FIG. 2 by way of the plurality of meandering lines in each of the four sides of the DSC 102. The temperature changes may have values and a profile as determined by well known solder reflow techniques as would be within the knowledge of a person skilled in the art. Thus, the temperature changes may include, in a conventional manner, progressively increasing temperature changes over a ramp up time period to a peak temperature, a substantially constant temperature change at the peak temperature corresponding to a liquidus temperature of the solder over a reflow time period, and progressively decreasing temperature changes over a ramp down time period back down to the reference temperature to solidify the solder. By way of example, the peak temperature may be about 225 degrees Celsius and the reference temperature, as noted above, may be about 22 degrees Celsius.

Figure 3:
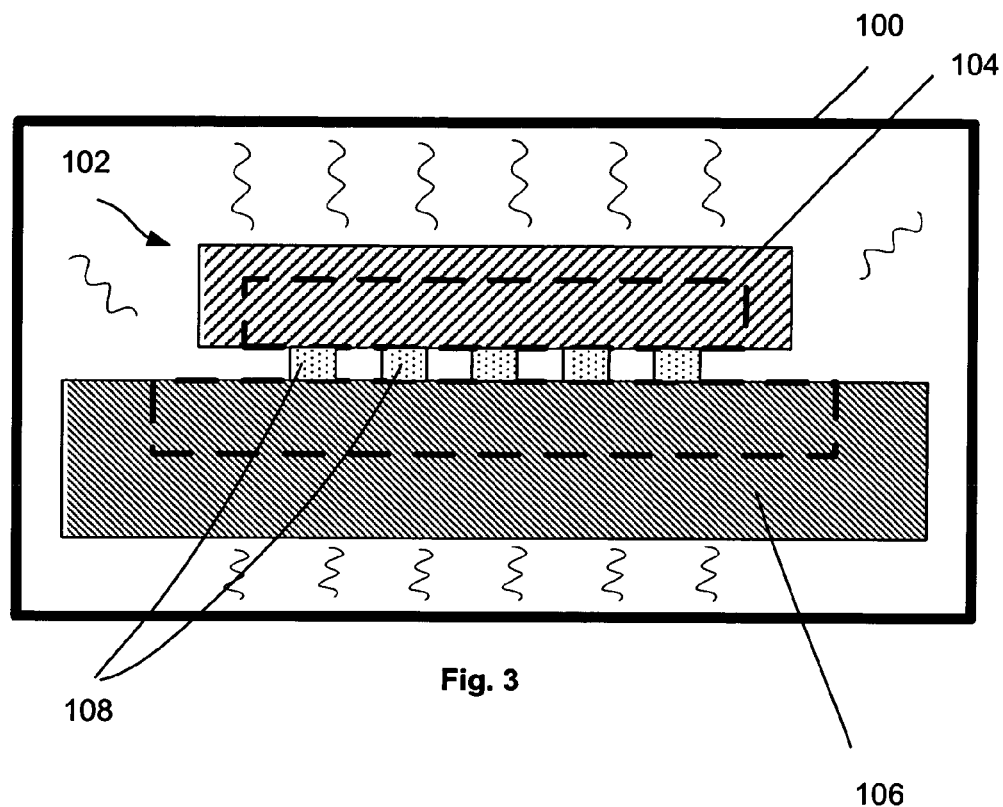
FIG. 3 is a view similar to FIG. 2 showing an uncontrolled expansion of the die and substrate during reflow.

Referring next to FIG. 3, the arrangement of FIG. 2 is shown where, during reflow as explained with respect to FIG. 2 above, an uncontrolled expansion of the die and the substrate occurs. As seen in FIG. 3, both die 104 and substrate 106 are shown as having expanded beyond their original limits (marked in broken lines) to new dimensions. An expansion amount of the die and the substrate is known to be obtainable by the following equation:

$$\Delta V/V = (3\alpha\Delta T) \tag{1}$$

where:
  $\Delta V$=volume change with respect to volume at the reference temperature;
  V=volume at the reference temperature;
  $\alpha$=coefficient of thermal expansion;
  $\Delta T$=temperature change with respect to the reference temperature.

It is clear to see from Equation (1) above that, to the extent that the substrate may typically have a coefficient of thermal expansion that is in the order of about ten times larger than the coefficient of thermal expansion of the silicon in the die, for a given temperature change, the substrate would expand in volume much more significantly than would the die. The above effect is shown schematically, and not to scale in FIG. 3.

Referring back now to FIG. 2 by way of example, according to a preferred embodiment, an expansion of each of the die and of the substrate may be controlled during a reflow of the solder within the chamber 100. Thus, a preferred embodiment contemplates controlling an expansion of the die and the substrate by exposing the DSC 102 to pressure changes at least during the cooling down period of reflow process corresponding to a solidification period of the solder. By "pressure changes," what is meant in the context of the present description are positive changes in pressure occurring over time as measured against a reference pressure, for example atmospheric pressure. In effect, the pressure changes denote elevated pressures as measured against the reference pressures. Such elevated pressures are indicated in FIG. 2 by way of the plurality of broken arrows on each of the four sides of the DSC 102. The pressure changes may be effected, according to a preferred embodiment, by using an isostatic press, such as any of the hot isostatic presses referred to above. Gases used to effect the pressure changes may include, by way of example, $Ar_2$, He, Ni, or any other inert gas as would be within the knowledge of a person skilled in the art. Most preferably, the pressure changes may include, in a conventional manner, progressively increasing pressure changes over the reflow ramp up time period, a substantially constant pressure change at a peak pressure over the peak temperature time period of the reflow process, and progressively decreasing pressure changes over the ramp down time period of the reflow process. By way of example, the peak pressure may be about 10,000 psi to about 19,000 psi. Preferably, a peak pressure may have a value of about 18,000 psi.

Referring still to FIG. 2, it has been found that the change in volume of the die and the substrate during reflow may more readily be obtained by the following:

$$\Delta V/V = (3\alpha\Delta T) - \Delta P/K \tag{2}$$

where:
  $\Delta V$=volume change with respect to volume at the reference temperature and reference pressure;
  V=volume at the reference temperature and reference pressure;
  $\alpha$=coefficient of thermal expansion;
  $\Delta T$=temperature change as measured against the reference temperature;
  $\Delta P$=pressure change as measured against a reference pressure;
  K=bulk modulus.

Equation (2) clearly denotes a relationship between pressure change and volumetric expansion of a given element. A preferred embodiment thus contemplates applying pressure changes, such as, in the shown embodiment of FIG. 2, pressure changes resulting from the application of an isostatic pressure, to the DSC 102 at least during a cooling down of the reflow process in order to control an expansion of the die and substrate. A controlling of the expansion of the die and substrate according to embodiments would mitigate differential expansions of the die and the substrate. By "mitigate," what is meant in the contest of the present description is either a partial or a total alleviation of the differential expansions of the die and the substrate. In other words, embodiments contemplate controlling an expansion of the die and the substrate at least during the cooling down period, such that, at any given point in time, a difference between an expansion of the die and an expansion of the substrate is less than it would have been without expansion control. According to a preferred embodiment, expansion control may be effected such that there exists expansion equilibrium, that is, a state where a difference between the respective expansions of the die and the substrate is negligible. Such a relationship between the relative expansions of the die and the substrate is schematically depicted in FIG. 2, which shows an expansion of die 104 beyond the broken lines marked within the die (and indicating the dimensions of the die at the reference temperature and pressure) as being comparable to the expansion of substrate 106 beyond the broken lines marked within the substrate (and indicating the dimensions of the substrate at the reference temperature and pressure). According to a more preferred embodiment, expansion control may be effected during an entire reflowing of the DSC. In order for the difference between the respective expansions noted above to be negligible, it has been found that the following relationship between the volume changes of the die and of the substrate may be observed:

$$\Delta V_d/V_d = \Delta V_s/V_s \quad (3)$$

where:

$\Delta V_d$=volume change of the die with respect to volume of the die at the reference pressure and temperature $V_d$=volume of the die at the reference temperature and reference pressure;

$\Delta V_s$=volume change of the substrate with respect to volume of the substrate at the reference pressure and temperature $V_s$=volume of the substrate at the reference temperature and reference pressure.

Referring to Equation (2), Equation (3) may then be rewritten in the form of Equation (4) as follows:

$$(3\alpha_d \Delta T_d) - \Delta P_d/K_d = (3\alpha_s \Delta T_s) - \Delta P_s/K_s \quad (4)$$

where:

$\alpha_d$=coefficient of thermal expansion of the die;

$\Delta T_d$=temperature change of the die as measured against the reference temperature;

$\Delta P_d$=pressure change of the die as measured against the reference pressure;

$K_d$=bulk modulus of the die;

$\alpha_s$=coefficient of thermal expansion of the substrate;

$\Delta T_s$=temperature change of the substrate as measured against the reference temperature;

$\Delta P_s$=pressure change of the substrate as measured against the reference pressure;

$K_s$=bulk modulus of the substrate;

Using Equation (4), if a control of the expansion of the die and of the substrate is to be effected through an exposure of the DSC to pressure changes, and given that, in such a case, during reflow, $\Delta T_d$ and $\Delta T_s$ would be equal, and $\Delta P_d$ and $\Delta P_s$ would be equal, then, the pressure changes to be applied to the DSC would be given by:

$$\Delta P = [3(\alpha_s - \alpha_d)\Delta T]/[(1/K_s) - (1/K_d)]. \quad (5)$$

Equation (5) provides a more preferred relationship between pressure changes that may be applied to a DSC according to embodiments as given by temperature changes dictated by the reflow process parameters. As suggested by Equation (5), according to a preferred embodiment, the pressure changes may be directly proportional to the temperature changes during reflow. However, Equation (5) assumes that material properties do not change as a function of temperature or pressure. A more general approach according to one embodiment would be to define a pressure increment (dP) for a small temperature change (dT) over which material properties are constant. Then, each incremental change in pressure versus incremental change in temperature would be given by Equation (6):

$$dP(P,T) = [3(\alpha_s(P,T) - \alpha_d(P,T))dT]/[1/K_s(P,T) - 1/K_d(P,T)] \quad (6)$$

A total pressure change would then be given by an integration of dP(P,T) over the temperature range.

Figure 4:
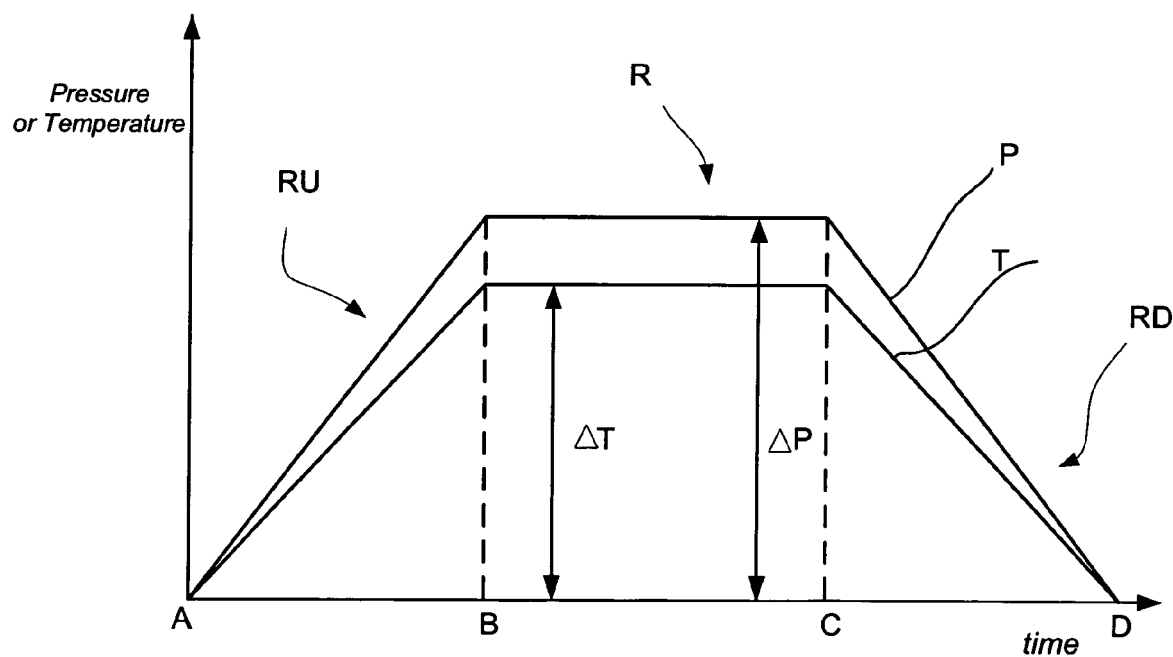
FIG. 4 is a graph showing a preferred relationship versus time of temperature changes and pressure changes applied to a die-substrate combination according to a preferred embodiment.

Referring next to FIG. 4, a graph is shown of a reflow temperature change versus time profile in a typical reflow process. FIG. 4 in addition includes a pressure change versus time profile during the noted reflow process according to a preferred embodiment, where the pressure change may for example be given by Equation (5) to follow a profile of the temperature change. As seen in FIG. 4, the reflow process includes a ramp up time period RU during which the temperature change and pressure change progressively increase from a starting point in time A corresponding to the reference temperature and pressure, and ramping up to a peak temperature and peak pressure at a point in time B. Between points in time B and C, both the temperature change and the pressure change are shown as remaining substantially constant over the reflow time period R corresponding to a liquidus temperature of the solder. Thereafter, between points in time C and D, both the temperature change and the pressure change progressively decrease over a ramp down time period RD back down to the reference temperature and reference pressure, respectively, at which point in time D the solder paste has completely solidified.

Figure 5A:
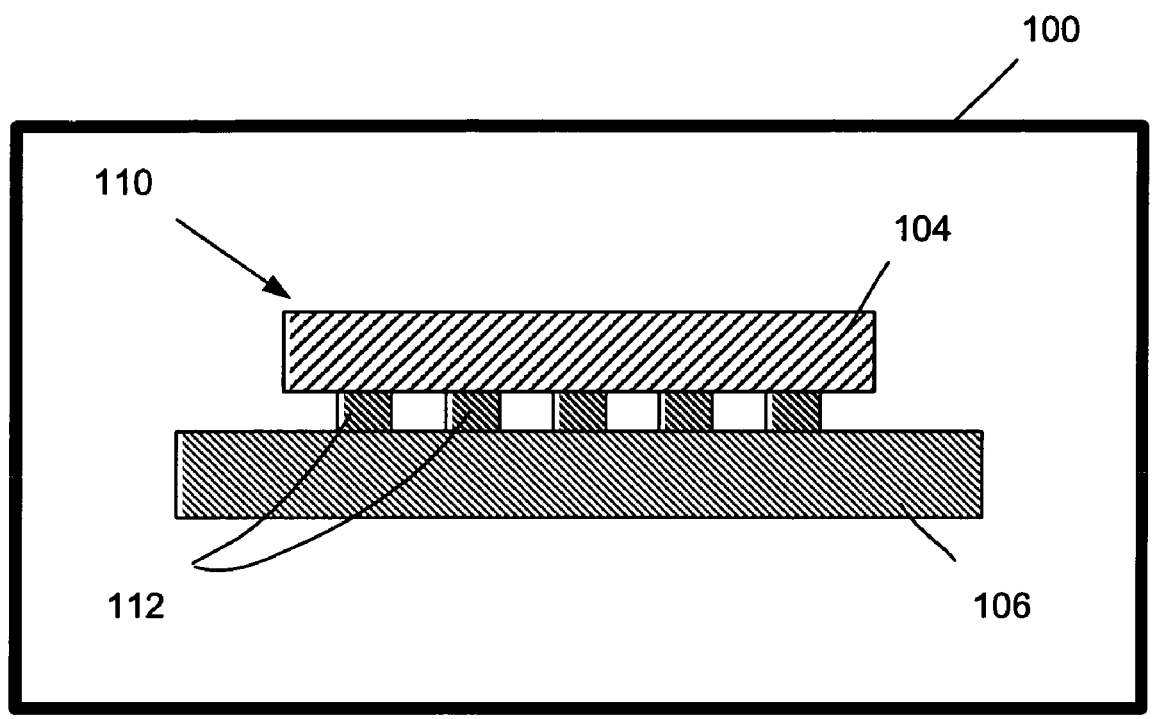
Figure 5B:
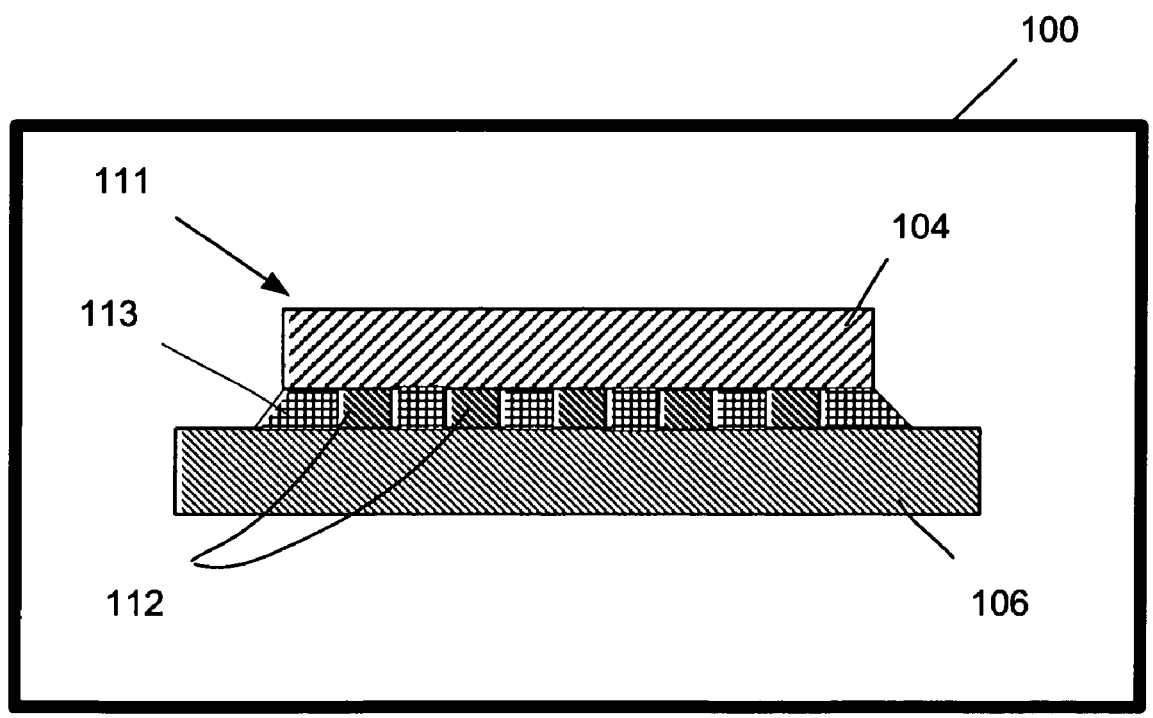

With respect to point in time D above, reference is made to FIGS. 5a and 5b. FIGS. 5a and 5b show respective packages 110 and 111 as having been formed from DSC 102 according to a preferred method embodiment after the end of the ramp down period RD, at which point in time solder joints 112 are shown as having formed between the die and the substrate. It is noted that the microelectronic package 110 shown in FIG. 5a may merely constitute an intermediate package, and may therefore be further processed, according to an embodiment as shown in FIG. 5b, by being provided with an underfill material 113, such as a capillary underfill material, between the die and the substrate in a well known manner. Although not shown, method embodiments also include within their scope expansion control not necessarily during reflow, but also during curing of an underfill material such as a capillary underfill material or a no flow underfill material. Thus, in such a case, expansion control, such as through the application of a pressure, for example, an isostatic pressure, could take place while the underfill material is curing.

Advantageously, a microelectronic package formed according to method embodiments exhibits a partial or total reduction in residual stresses in the die and substrate after an attachment of the die to the substrate. Such a reduction will advantageously enhance a thermal fatigue performance of the package and reliability of the joints, such as C4 joints between the die and the substrate, and between ILD layers in the die. Method embodiments work with existing capillary flow underfill epoxies and equipment and with existing lead free solders and die bumps. Additionally, method embodiments do not require changes in the interconnect design of either the die or the substrate, or any changes in the materials of the die and the substrate.

Advantageously, preferred method embodiments enable the use of ILD where the dielectric constant may be decreased indefinitely, since a residual ILD stress may be rendered negligible according to preferred method embodiments. Additionally, method embodiments are applicable to an entire range of substrate and die form factors, including single die, multiple-chip package, large die and small die form factors. Optimal processing parameters according to preferred method embodiments may be dictated by substrate and die material properties rather than by substrate and die form factors. In addition, method embodiments may be used to lower residual stress from the underfill process as well, such as, as mentioned above, during curing of a capillary underfill material or a no flow underfill material.

Although an exemplary embodiment of a method of forming a microelectronic package has been described with respect to FIGS. 1-5, embodiments are not so limited, and comprise within their scope any form of expansion control to mitigate differential expansion of the die and the substrate, as would be within the knowledge of a person skilled in the art. Thus, expansion control according to embodiments encompasses to application of pressure not only via hydrostatics, but through any means that would achieve the expected results, such as, for example, through mechanical means. In addition, method embodiments include within their ambit expansion control not strictly throughout the duration of reflow, but at least during the cool down period of reflow in order to compensate for the differential expansions of the die and the substrate during cool down. In such a case, where expansion control includes the application of pressure changes, such pressure changes may be initiated before a liquidus-solidus transition point of the solder such that an expansion equilibrium would occur before such transition takes place, and further such that a ramping down of the temperature and of the pressure would to synchronized to reach the reference point at the same time.

Figure 6:
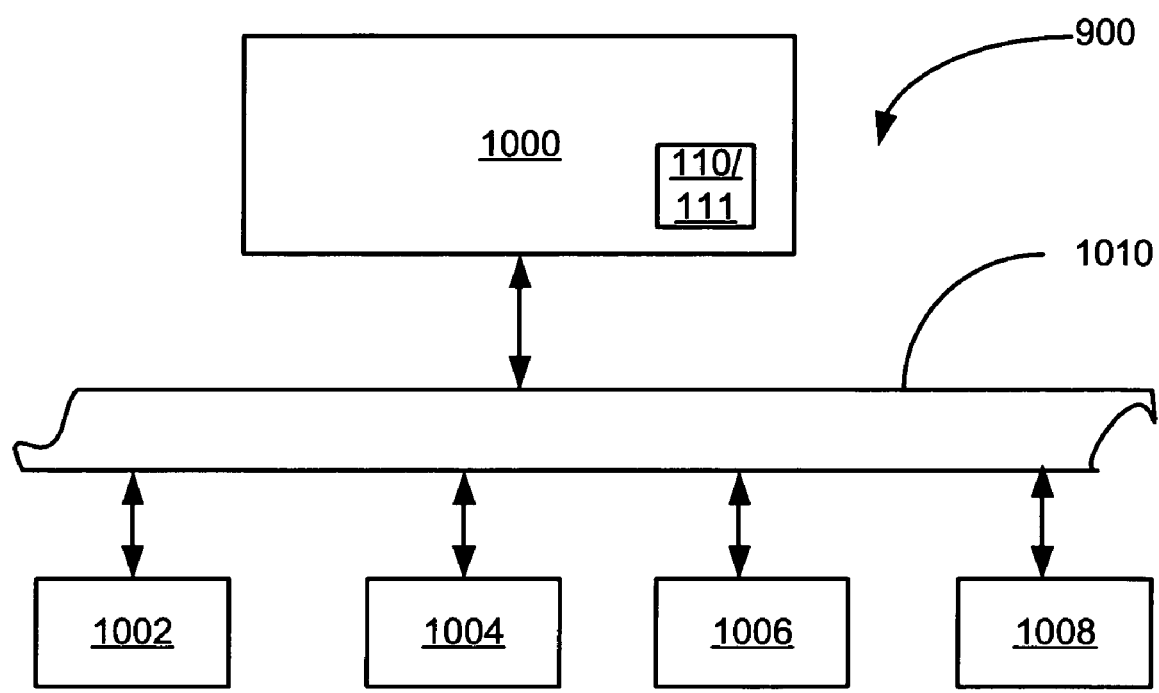
FIG. 6 is a schematic illustration of a system incorporating a microelectronic package formed according to method embodiments.

Referring to FIG. 6, there is illustrated one of many possible systems 900 in which embodiments of the present invention may be used. In one embodiment, the electronic assembly 1000 may include a microelectronic package, such as packages 110 or 111 of FIG. 5a or 5b. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 6, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 900 may be a wireless mobile phone, a personal digital assistant, a pocket PC, a tablet PC, a notebook PC, a desktop computer, a set-top box, a media-center PC, a DVD player, and a server.

Supporting Data:

Closed form calculations (discussed with respect to Equations (1)-(5) above) as well as numerical simulations based on the finite element method (discussed below) were completed to assess the stress benefits that can be realized from method embodiments. An objective of the following modeling studies was to calculate the optimal hydrostatic pressure that would minimize the post die-attach die warpage and ILD stress.

As a first step, as will be referred to herein as "Case #1" the results of which are shown in Table 1 below, the substrate and die were assumed to be linear elastic with a fixed elastic modulus and thermal expansion coefficient, CTE. The elastic-plastic response of the C4 joints between the die and substrate was not accounted for in these first analyses and a small strain assumption was made. These approximations helped to solve the problem in closed form and guide calibration of more complicated numerical models. The differential volumetric strain (between die and substrate) that would result at the peak temperature and its impact on post chip-attach die warpage and ILD stress (after cool down to the reference temperature) was assessed, as set forth in Table 1.

TABLE 1

| Case | Pressure (Mpa) | Warpage (um) | Purpose |
|---|---|---|---|
| Case #1 | 0 | 104 | Checking the model |
| Substrate | 0.132 | 103.9 | Pressure for warpage = 0 |
| Assumed to be linear elastic | 13.2 | 93.6 | $\Delta P = [3 (\alpha_s - \alpha_d) \Delta T]/$ |
| E = 15.6 GPa (Young's Modulus) | 25 | 84.3 | $[(1/K_s) - (1/K_d)]$. |
| nu = 0.21 (Poisson's ratio) | 50 | 64.5 | $\Delta P = 132.72$ MPa |
| CTE = 25 | 75 | 45 | |
| Die | 100 | 21 | |
| Assumed to be linear elastic | 132 | 0.4 | |
| E = 155 Gpa | | | |
| nu = 0.27 | | | |
| CTE = 2.3 | | | |
| Case #2 | 0 | 44 | Predicting |
| Substrate | 25 | 32.8 | relationship between |
| Assumed to be non-linear elastic | 50 | 21 | pressure and |
| Assumed to have a pressure and | 75 | 7.4 | warpage |
| temperature dependent stiffness and | 85 | 1 | |
| CTE | 90 | −0.8 | |
| Interface | 100 | −1.37 | |
| Elastic plastic | | | |
| Die | | | |
| Linear elastic | | | |

A corresponding 3D finite element model was constructed to estimate the die warpage post chip-attach. The silicon die, a layer mechanically representative of C4 joints and substrate were included in the model. In the first set of analyses referred to as Case #1 in Table 1, all materials were assumed to be linear elastic with temperature and pressure independent properties. The entire system was subjected to a simulated hydrostatic pressure. The temperature and pressure relationship versus time shown in FIG. 4 was simulated in the model. The post chip-attach warpage as a function of maximum applied pressure predicted by the model were compared to the closed-form solution obtained by hand calculation. It was observed that the model and closed-form solution agreed in their warpage predictions. Furthermore, from Table-1, the closed-form solution suggests that a peak pressure of 132 MPa would result in negligible differential volumetric strain at reflow temperature and negligible die warpage post chip-attach. The finite element model corroborates this prediction, thereby, establishing confidence in its predictions.

Figure 7:
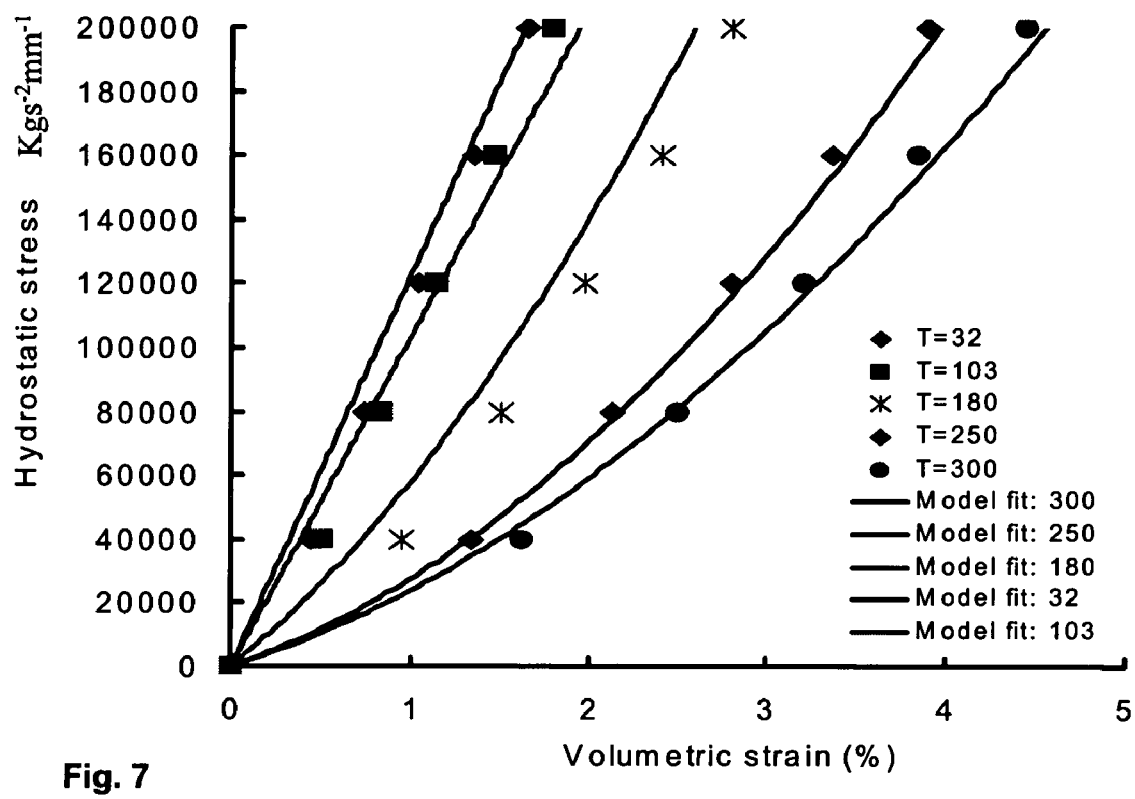
FIG. 7 is a graph correlating experimentally measured hydrostatic stress with modeled hydrostatic stress.

In reality, for the range of pressures and temperatures that are likely to be encountered in method embodiments, the bulk modulus and CTE of the substrate are expected to be strongly pressure and temperature dependent. Furthermore, the C4 joints between the die and substrate (especially the substrate solder balls) tend to exhibit an elastic plastic response. Hence, in the second set of models referred to as "Case #2" in Table 1, these non-linear effects were given full consideration. To measure the pressure and temperature dependent bulk modulus and CTE of the substrate, PVT experiments were performed on CPU substrates from samples cut in the die shadow region. Briefly, such an experiment involves performing temperature sweeps at various pressures on these substrate samples in a high-pressure dilatometer while measuring the volume change. The applied hydrostatic pressure vs. volume change at various temperatures measured from the PVT experiments are shown in FIG. 7, and the data plotted in Tables 3a and 3b below. FIG. 7 presents a graph of applied hydrostatic pressure versus volumetric strain for a CPU substrate measured from PVT experiments performed in a high pressure dilatometer. Table 3a presents average measured properties from PVT tests on CPU substrate samples, while Table 3b presented a linear elastic prediction for ILD stress reduction as a function of peak pressure during reflow with expansion control according to a volumetric strain difference formula yielded by the data in FIG. 7 at a peak temperature of 225 degrees Celsius.

TABLE 3a

|  | CTE (1/C) | Young's Modulus (E) (Pa) | Poisson's Ratio (↑) | Bulk Modulus (K) (Pa) |
|---|---|---|---|---|
| Si | 2.80E−06 | 1.50E+11 | 0.23 | 9.26E+10 |
| substrate | 2.50E−05 | 2.20E+10 | 0.14 | 8.00E+09 |

TABLE 3b

| peak Pressure (psi) | peak pressure (Pa) | vol. strain difference (sub-Si) | ILD stress (PCCA/POR) |
|---|---|---|---|
| 0 | 0.00E+00 | 1.50E−02 | 1.00 |
| 2,000 | 1.38E+07 | 1.34E−02 | 0.89 |
| 4,000 | 2.76E+07 | 1.18E−02 | 0.79 |
| 6,000 | 4.14E+07 | 1.03E−02 | 0.68 |
| 8,000 | 5.52E+07 | 8.69E−03 | 0.58 |
| 10,000 | 6.90E+07 | 7.11E−03 | 0.47 |
| 12,000 | 8.27E+07 | 5.54E−03 | 0.37 |
| 14,000 | 9.65E+07 | 3.96E−03 | 0.26 |
| 16,000 | 1.10E+08 | 2.39E−03 | 0.16 |
| 18,000 | 1.24E+08 | 8.12E−04 | 0.05 |
| 19,000 | 1.31E+08 | 2.42E−05 | 0.00 |
| 20,000 | 1.38E+08 | −7.63E−04 | −0.05 |

Figure 8:
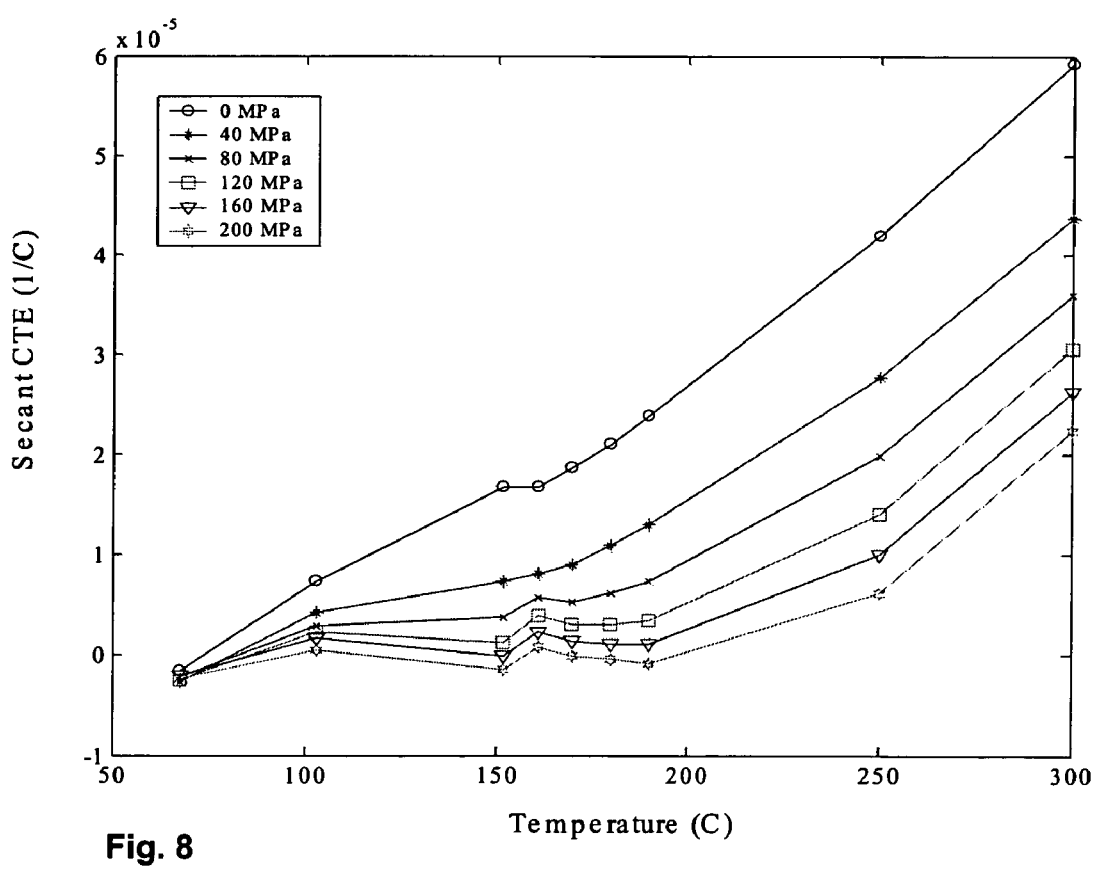
FIG. 8 is a graph correlating experimentally measured CTE with modeled CTE.

A material model to represent this data was developed in the Abaqus® finite element program manufactured by Abaqus, Inc. of Providence, R.I., USA. A correlation of the model with the measurements is shown in FIG. 7. Correlation between the measured data (symbols in FIG. 7) and non-linear elastic material model fit in Abaqus® (solid lines in FIG. 7). The instantaneous bulk moduli K as a function of temperature and pressure may be calculated at the tangents to the shown curves. Similarly, a temperature and pressure dependent CTE graph is shown in FIG. 8. To account for the elastic-plastic properties of the C4 joints, the corresponding properties (temperature-dependent elastic modulus and yield stress) measured were used in the model. All of the above described material properties were utilized in the second set of numerical simulations of Case #2 set forth in Table 1 above. Here, the final die warpage resulting after chip-attach is shown as a function of the peak hydrostatic pressure as shown in FIG. 4. As expected, an increase in peak hydrostatic pressure results in a smaller differential thermal volumetric expansion at reflow or peak temperature and consequently a lower post chip-attach die warpage. The non-linear simulations account for the softening of the substrate with increasing temperature and hence predict a lower pressure to achieve a particular warpage reduction compared to the linear elastic simulations.

A finding from the modeling study set forth above was that a peak hydrostatic pressure corresponding to 85-90 MPa may be optimal and would be expected to yield zero die warpage post chip-attach. Contour plots comparing the post chip attach die warpage between the prior art process (a prior art CAM or prior art "Chip Attach Module" process in a reflow oven under atmospheric pressure 14 Psi) and method embodiments at the nearly optimal pressure found in the modeling study above (i.e. 85 MPa, 12440 Psi) a show that warpage may be rendered negligible with method embodiments as compared with the prior art process not involving expansion control.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of forming a microelectronic package comprising:
providing a die-substrate combination to a hot isostatic press chamber, the die-substrate combination including a substrate, a die disposed on the substrate, and a material to be cured disposed between the die and the substrate;
curing the material to be cured in the hot isostatic press chamber by exposing the die-substrate combination to temperature and hydrostatic pressure changes and thereafter cooling down the die-substrate combination in the isostatic press chamber until the material to be cured has cured to yield the package;
wherein cooling down comprises applying a hydrostatic pressure to the die-substrate combination to mitigate a coefficient of thermal expansion mismatch between the die and substrate that would otherwise exist at atmospheric pressure.

2. The method of claim 1, wherein:
the material to be cured comprises solder paste; and
curing further comprises reflowing the solder paste, and cooling down the die-substrate combination until the solder paste solidifies to form solder joints.

3. The method of claim 2, wherein reflowing comprises:
increasing a value of the temperature changes over a ramp up time period;
maintaining a substantially constant temperature change over a reflow time period;
decreasing a value of the temperature changes over a ramp down period.

4. The method of claim 3, wherein exposing the die-substrate combination to temperature and hydrostatic pressure changes comprises:
increasing a value of the hydrostatic pressure changes over the ramp up time period;
maintaining a constant hydrostatic pressure change over the reflow time period; and
decreasing a value of the temperature changes over a ramp down period.

5. The method of claim 1, wherein applying a hydrostatic pressure to the die-substrate combination during cooling down comprises exposing the die-substrate combination to hydrostatic pressure changes.

6. The method of claim 5, wherein the pressure changes are a function of the temperature changes.

7. The method of claim 5, wherein exposing comprises decreasing hydrostatic pressure changes on the die-substrate combination during cooling down.

8. The method of claim 7, wherein decreasing and cooling down are effected such that the die-substrate combination reaches atmospheric pressure and room temperature contemporaneously.

9. The method of claim 1, wherein:
assigning $\Delta P$ to represent each of the pressure changes;
assigning $\Delta T$ to represent each of the temperature changes;
assigning $\alpha_d$ to represent the coefficient of thermal expansion of the die;
assigning $\alpha_s$ to represent the coefficient of thermal expansion of the substrate;
assigning $K_d$ to represent the bulk modulus of the die; and
assigning $K_s$ to represent the bulk modulus of the substrate;
a relationship between $\Delta P$ and $\Delta T$ is given by:

$$\Delta P = [3(\alpha_s - \alpha_d)\Delta T]/[(1/K_s) - (1/K_d)].$$

10. The method of claim 1, wherein applying hydrostatic pressure changes comprises using a high pressure inert gas to apply to pressure.

11. The method of claim 10, wherein the gas comprises at least one of Argon, Helium or Nitrogen.

12. The method of claim 1, wherein applying hydrostatic pressure changes comprises applying a peak hydrostatic pressure between about 10,000 psi and 19,000 psi.

13. The method of claim 12, wherein the peak hydrostatic pressure is about 18,000 psi.

14. The method of claim 1, wherein exposing the die-substrate combination to temperature and hydrostatic pressure changes comprises heating the die-substrate combination to a peak temperature of about 225 degrees Celsius.

15. The method of claim 1, wherein cooling down comprises cooling down to a base temperature of about 22 degrees Celsius.

16. The method of claim 1, wherein exposing the die-substrate combination to temperature and hydrostatic pressure changes comprises
heating the die-substrate combination up to a peak temperature and holding the die-substrate combination at the peak temperature for a predetermined holding time; and
exposing the die-substrate combination to hydrostatic pressure changes up to a peak hydrostatic pressure and holding the die-substrate combination at the peak hydrostatic pressure for the predetermined holding time; and
holding the die-substrate combination at the peak temperature and holding the die-substrate combination at the peak hydrostatic pressure are contemporaneous.

17. The method of claim 16, wherein the predetermined holding time is about 7 minutes.

18. The method of claim 1, wherein:
the material to be cured comprises an underfill material.

* * * * *